(12) United States Patent
Mehta et al.

(10) Patent No.: US 10,153,094 B2
(45) Date of Patent: Dec. 11, 2018

(54) SUPERCAPACITOR STRUCTURES

(71) Applicant: The Paper Battery Co., Troy, NY (US)

(72) Inventors: Shreefal Mehta, Loudonville, NY (US); Anthony Sudano, Laval (CA); Dave Rich, Middleburgh Heights, OH (US); Renato Friello, Schnectady, NY (US)

(73) Assignee: THE PAPER BATTERY CO., Troy, NY (US)

( * ) Notice: Subject to any disclaimer, the term of this patent is extended or adjusted under 35 U.S.C. 154(b) by 1 day.

(21) Appl. No.: 15/372,584

(22) Filed: Dec. 8, 2016

(65) Prior Publication Data

US 2017/0092438 A1 Mar. 30, 2017

Related U.S. Application Data

(62) Division of application No. 14/041,624, filed on Sep. 30, 2013, now Pat. No. 9,564,275.

(Continued)

(51) Int. Cl.
*H01G 11/10* (2013.01)
*H01G 11/12* (2013.01)
(Continued)

(52) U.S. Cl.
CPC .............. *H01G 11/12* (2013.01); *H01G 2/22* (2013.01); *H01G 11/08* (2013.01); *H01G 11/10* (2013.01);
(Continued)

(58) Field of Classification Search
CPC ........ H01G 11/12; H01G 11/24; H01G 11/72; H01G 11/10; H05K 1/18
(Continued)

(56) References Cited

U.S. PATENT DOCUMENTS 5,587,250 A 12/1996 Thomas et al.
5,659,455 A 8/1997 Herbert
(Continued)

FOREIGN PATENT DOCUMENTS

CN 101814773 A 8/2010
CN 102044905 A 5/2011
(Continued)

OTHER PUBLICATIONS

International Search Report and Written Opinion for PCT Application No. PCT/US2014/030141, dated Jul. 28, 2014 (15 pages).
(Continued)

*Primary Examiner* — Eric Thomas
*Assistant Examiner* — Arun Ramaswamy
(74) *Attorney, Agent, or Firm* — Kevin P. Radigan, Esq.; Heslin Rothenberg Farley & Mesiti P.C.

(57) ABSTRACT

Supercapacitor structures are provided which include, for example: one or more layers of supercapacitors; and one or more contact tabs. The one or more contact tabs electrically contact and extend outward from the supercapacitor structure to facilitate electrical connection to the supercapacitor structure, and the one or more contact tabs include a multi-contact tab. The multi-contact tab is configured and sized with multiple contact locations which are disposed external to the supercapacitor structure. Various supercapacitor structures are provided, including one supercapacitor structure with a shared C-shaped current collector, and another supercapacitor structure with stacked supercapacitors. One or more additional multi-contact tabs may also extend from the supercapacitor structure(s) and distribute the same or a different capacitor voltage than the multi-contact tab.

21 Claims, 8 Drawing Sheets

Related U.S. Application Data

(60) Provisional application No. 61/801,206, filed on Mar. 15, 2013.

(51) Int. Cl.
*H01G 11/72* (2013.01)
*H05K 1/18* (2006.01)
*H01G 11/24* (2013.01)
*H01G 2/22* (2006.01)
*H01G 11/08* (2013.01)
*H01G 11/76* (2013.01)
*H01G 11/82* (2013.01)
*H01M 10/42* (2006.01)
*H05K 1/02* (2006.01)

(52) U.S. Cl.
CPC ............ *H01G 11/24* (2013.01); *H01G 11/72* (2013.01); *H01G 11/76* (2013.01); *H01G 11/82* (2013.01); *H01M 10/4264* (2013.01); *H05K 1/0231* (2013.01); *H05K 1/18* (2013.01); *H05K 2201/10015* (2013.01); *Y02E 60/13* (2013.01)

(58) Field of Classification Search
USPC .................................. 361/502, 523, 520, 522
See application file for complete search history.

(56) References Cited

U.S. PATENT DOCUMENTS

| | | |
|---|---|---|
| 5,907,471 A | 5/1999 | Patel et al. |
| 6,252,762 B1 | 6/2001 | Amatucci |
| 6,517,972 B1 | 2/2003 | Amatucci |
| 7,099,138 B1 | 8/2006 | Togashi et al. |
| 7,218,489 B2 | 5/2007 | Wilk et al. |
| 7,388,362 B2 | 6/2008 | Yurgil |
| 7,554,790 B2 | 6/2009 | James et al. |
| 7,667,438 B2 | 2/2010 | Ashtiani et al. |
| 7,701,695 B2 | 4/2010 | Sutardja |
| 8,134,333 B2 | 3/2012 | Elder et al. |
| 8,334,017 B2 | 12/2012 | Pushparaj et al. |
| 8,373,971 B2 | 2/2013 | Young |
| 8,514,548 B2 | 8/2013 | Miller et al. |
| 8,685,287 B2 | 4/2014 | Worsley et al. |
| 9,564,275 B2 | 2/2017 | Mehta et al. |
| 2006/0002099 A1 | 1/2006 | Stonehame et al. |
| 2007/0195487 A1 | 8/2007 | James et al. |
| 2009/0072782 A1 | 3/2009 | Randall |
| 2009/0206657 A1 | 8/2009 | Vuk et al. |
| 2010/0232124 A1 | 9/2010 | Bang |
| 2011/0013344 A1 | 1/2011 | Remizov et al. |
| 2011/0051320 A1 | 3/2011 | Miller et al. |
| 2012/0125674 A1* | 5/2012 | Miyahara ............ H01G 2/06 174/260 |
| 2012/0139492 A1 | 6/2012 | Kleffel |
| 2012/0288747 A1* | 11/2012 | Naoi .................. H01G 11/12 429/178 |
| 2013/0082520 A1 | 4/2013 | Leemans et al. |
| 2013/0283847 A1 | 10/2013 | Baumann et al. |
| 2014/0035098 A1 | 2/2014 | Dunn et al. |
| 2014/0103857 A1 | 4/2014 | Marten |
| 2014/0154593 A1 | 6/2014 | Rojeski |
| 2014/0167515 A1 | 6/2014 | Feuerstack et al. |
| 2014/0184161 A1 | 7/2014 | Deal et al. |
| 2014/0265553 A1 | 9/2014 | McGee |
| 2014/0339902 A1 | 11/2014 | Sepe, Jr. et al. |
| 2015/0024240 A1 | 1/2015 | Seubert et al. |

FOREIGN PATENT DOCUMENTS

| | | |
|---|---|---|
| CN | 103339787 A | 10/2013 |
| DE | 102013201909 A1 | 8/2014 |
| EP | 1116249 A1 | 7/2001 |
| EP | 1543533 A2 | 6/2005 |
| EP | 2091055 A2 | 8/2009 |
| EP | 2459483 A2 | 6/2012 |
| EP | 2707916 A1 | 3/2014 |
| JP | 07240351 A | 9/1995 |
| JP | 11016780 A | 1/1999 |
| JP | H-11106780 A | 4/1999 |
| JP | 2002-532869 A | 10/2002 |
| JP | 2003115423 A | 4/2003 |
| JP | 2003-530658 A | 10/2003 |
| JP | 2006210719 A | 8/2006 |
| JP | 2010232574 A | 10/2010 |
| JP | 2011-216858 A | 10/2011 |
| JP | 2012023802 A | 2/2012 |
| JP | 2013-038192 A | 2/2013 |
| JP | 2013-504180 A | 2/2013 |
| WO | 2010120813 A2 | 10/2010 |
| WO | 2011017130 A1 | 2/2011 |
| WO | 2012021154 A1 | 2/2012 |
| WO | 2012125968 A1 | 9/2012 |

OTHER PUBLICATIONS

Mehta et al., Supplementary Partial European Search Report for EP14763736.7, dated Nov. 21, 2016 (2 pages).

* cited by examiner

SUPERCAPACITOR STRUCTURES

CROSS-REFERENCE TO RELATED APPLICATIONS

This application is a divisional of U.S. Ser. No. 14/041,624, filed Sep. 30, 2013, which published on Sep. 18, 2014, as U.S. Patent Publication No. 2014/0268617 A1, and claims priority from U.S. provisional patent application No. 61/801,206, filed Mar. 15, 2013. Each of these applications is hereby incorporated herein by reference in its entirety. In addition, this application is also related to U.S. provisional patent application Ser. No. 61/884,338, entitled "Bendable Cell", which is also hereby incorporated herein by reference in its entirety. Further, this application is related to U.S. Pat. No. 8,514,548 B2, issued Aug. 20, 2013, and U.S. patent application Ser. No. 13/417,199, filed Mar. 9, 2012, which was published on Jan. 16, 2014, as U.S. Patent Publication No. 2014/0014403 A1, both of which are also hereby incorporated herein by reference in their entirety.

FIELD OF THE INVENTION

The present invention relates to energy storage devices, including supercapacitors, and more particularly to enhanced supercapacitor structures with one or more layers of supercapacitors and to various configurations of contact or distribution tabs for electrically contacting the supercapacitor structure(s).

BACKGROUND

Mobile consumer electronic devices, such as smart phones, tablet computers, portable media players, etc., may have many energy consuming components and subsystems, such as, for example, displays, radio transceivers, processors, and camera flash devices, etc. Each component or subsystem may have different electrical requirements, including, for instance, different operating requirements for voltage, current, and power. Meeting these varying requirements, within a desired form factor and cost, can pose considerable design challenges.

SUMMARY

The shortcomings of the prior art are overcome, and additional advantages are provided through the provision, in one aspect, of a device which includes: a supercapacitor structure, the supercapacitor structure including one or more layers of supercapacitors; and one or more contact tabs, the one or more contact tabs electrically contacting and extending outward from the supercapacitor structure to facilitate electrical connection to the supercapacitor structure, and the one or more contact tabs including a multi-contact tab, the multi-contact tab being configured and sized with multiple contact locations disposed external to the supercapacitor structure.

In another aspect, a device is provided which includes: an electronic structure; and a supercapacitor structure. The supercapacitor structure includes one or more layers of supercapacitors, and comprises a sheet structure configured and sized to overlie at least a portion of the electronic structure to, in part, facilitate electromagnetic shielding of the electronic structure.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
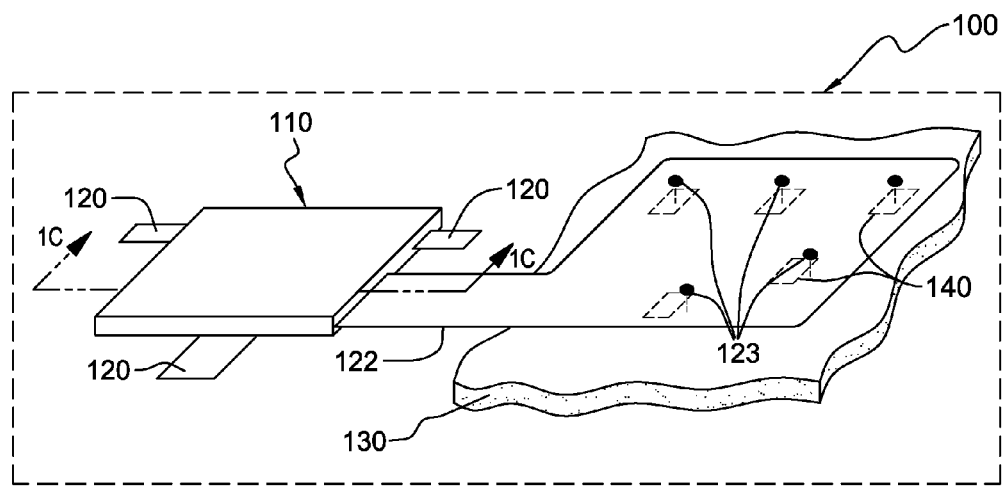
FIG. 1A depicts one embodiment of an electronic assembly or device having a supercapacitor structure with one or more contact tabs extending therefrom, including a multi-contact tab, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Disclosed herein are electronic assemblies or devices which include supercapacitor structures, each having one or more supercapacitor(s). As used herein, a "supercapacitor" comprises for instance, an electrochemical capacitor that includes an electrolyte disposed between electrodes, and may be integrated with, for instance, a structure, such as a battery, in a hybrid supercapacitor configuration. An "electrolyte" is a substance, usually liquid, through which electricity may pass. One example of a supercapacitor is an electrochemical double layer capacitor (EDLC), which stores electrical energy by, for example, the separation of charge, for instance, in a double layer of ions, at the interface between the surface of a conductive electrode and an electrolyte. Another term for a supercapacitor is an ultra-capacitor. In one embodiment, a supercapacitor may be a stacked structure including a first current collector, a first electrode, a separator, a second electrode, and a second current collector, with an electrolyte disposed between the electrodes.

In another example, a supercapacitor is an asymmetric or hybrid supercapacitor, and could have one or more battery-type electrodes and one or more capacitor-type electrodes. In such an example, the supercapacitor could have one or more electrodes that support faradaic charging, and one or more electrodes that support capacitive charging.

In addition, as used herein, an energy storage device may be a supercapacitor, a capacitor, a battery, a fuel cell, or any other device or structure capable of storing electrical energy. The energy density (or specific energy) of an energy storage device is defined as the amount of energy stored per unit mass of the device, while the power density is defined as the rate (per unit mass) at which energy may be transferred to or from the device. As one example, an activated carbon supercapacitor may have, for example one-tenth of the energy density of a conventional lithium-ion rechargeable battery, while having, for example, 10-100 times the power density of the conventional lithium-ion rechargeable battery.

Generally stated, provided herein, in one aspect, is an enhanced electronic assembly or device which includes a supercapacitor structure, and one or more contact tabs. The supercapacitor structure includes one or more layers of supercapacitors, and one or more electrically conductive contact tabs electrically contacting and extending outward from the supercapacitor structure to facilitate electrical connection to the supercapacitor structure. The one or more contact tabs include at least one multi-contact tab. The multi-contact tab is configured and sized with multiple contact locations thereto disposed external to the supercapacitor structure. In one specific embodiment, the multi-contact tab is a sheet or film tab designed to overlie (or underlie) multiple components of, for instance, one or more circuit board assemblies.

In one embodiment, the electronic assembly or device is associated with (or includes) a circuit board assembly, and the multi-contact tab is configured and sized to reside over at least a portion of the circuit board assembly to, in part, facilitate electromagnetic interference shielding thereof. In this embodiment, the multiple contact locations of the multi-contact tabs facilitate multiple electrical connections between the circuit board assembly, such as one or more components mounted to the circuit board assembly, and the supercapacitor structure. In one embodiment, the circuit board assembly may include one or more components having a main surface area, and the multi-contact tab may include a film tab with a surface area at least as large as the main surface area of the one or more components. In addition, the supercapacitor structure may be disposed over another portion of the circuit board assembly, including over one or more other components mounted to the circuit board assembly so as to facilitate, in part, electromagnetic interference shielding of the one or more other components. In one specific implementation, the multi-contact tab is a film or sheet tab with a surface area larger than a surface area of a main surface of the supercapacitor structure.

In another embodiment, the supercapacitor structure is configured and sized to reside over at least a portion of a main surface of a battery to, in part, facilitate electromagnetic interference shielding of the battery. By way of example, the supercapacitor structure may include a flexible sheet that is sized and configured to wrap around and at least partially cover opposing main surfaces of the battery to facilitate electromagnetic interference shielding of the battery.

As a further example, the supercapacitor structure may include a shared C-shaped current collector, such as a bipolar C-shaped current collector, and the one or more layers of supercapacitors may include a first supercapacitor and a second supercapacitor. The first and second supercapacitors may each include or utilize the shared C-shaped current collector. In one implementation, the shared C-shaped current collector at least partially encircles the first and second supercapacitors. For instance, the first and second supercapacitors may reside within the shared C-shaped current collector of the supercapacitor structure. In one implementation, the multi-contact tab may electrically contact and extend outward from the shared C-shaped current collector of the supercapacitor structure. In another implementation, the first supercapacitor may include another current collector, and the one or more contact tabs may include another multi-contact tab. The another multi-contact tab may be configured and sized with multiple contact locations disposed external to the supercapacitor structure to further facilitate electrical connection to the supercapacitor structure, and the another multi-contact tab may electrically contact to the another current collector. In this embodiment, the multi-contact tab may distribute a first voltage, and the another multi-contact tab may distribute a second voltage, wherein the first and second voltages are different voltages provided or distributed from the supercapacitor structure. In one implementation, the multi-contact tab may be configured and sized to, in part, provide electromagnetic interference shielding to a majority of an associated circuit board assembly. For instance, the multi-contact tab may extend within the circuit board assembly, or overlie the circuit board assembly at one or the other main surface thereof.

In one implementation, the one or more layers of supercapacitors may include a first supercapacitor and a second supercapacitor disposed in a stack. The first supercapacitor may include a shared current collector and a negative current collector, and the second supercapacitor may include the shared current collector, and a positive current collector. In this embodiment, the shared current collector may reside between the negative and positive current collectors, and the multi-contact tab may electrically contact the shared current collector of the first and second supercapacitors in the stack. The one or more contact tabs may further include another multi-contact tab. The another multi-contact tab may be configured and sized with multiple contact locations disposed external to the supercapacitor structure to facilitate electrical connection to the supercapacitor structure, and the another multi-contact tab may electrically contact one of the negative current collector or the positive current collector. By way of example, the multi-contact tab and the another multi-contact tab may extend from the same side of a supercapacitor structure, or, for instance, from opposite sides of the supercapacitor structure.

In one implementation of the above structure, the multi-contact tab is configured and sized to cover a first portion of one or more circuit board assemblies, and the multiple contact locations of the multi-contact tab facilitate multiple electrical connections between the first portion of the one or more circuit board assemblies and the supercapacitor structure, and the another multi-contact tab is configured and sized to cover a second portion of the one or more circuit board assemblies, and the multiple contact locations of the another multi-contact tab facilitate multiple electrical connections between the second portion of the one or more circuit board assemblies and the supercapacitor structure. In one example, the multi-contact tab may reside over a first circuit board assembly, and the another multi-contact tab may reside over a second circuit board assembly. In addition, the multi-contact tab may be electrically connected to the supercapacitor structure to distribute a first voltage, and the second multi-contact tab may be electrically connected to the supercapacitor structure to distribute a second voltage, wherein the first voltage and the second voltage are different voltages.

In a further implementation, the one or more layers of supercapacitors of the supercapacitor structure may include a first supercapacitor and a second supercapacitor, with the first supercapacitor being electrically isolated from the second supercapacitor within the supercapacitor structure, and with the multi-contact tab electrically contacting the first supercapacitor. In this embodiment, the multi-contact tab may be a first contact tab, and the one or more contact tabs may further include a second contact tab, the second contact tab being electrically connected to the second supercapacitor of the supercapacitor structure. In one embodiment, the first contact tab is electrically connected to the first supercapacitor to distribute a first voltage, and the second contact tab is electrically connected to the second supercapacitor to distribute a second voltage, with the first and second voltages being different voltages. In one implementation, the first contact tab electrically connected to the first supercapacitor has a first resistance capacitance (RC) time constant, and the second contact tab electrically connected to the second supercapacitor has a second RC time constant, wherein the first RC time constant and the second RC time constant are (e.g., are tailored to be) different RC time constants, dependent on the desired distribution characteristics for the supercapacitor voltage to one or more components or one or more associated circuit board assemblies.

In another implementation, an electronic assembly or device is provided which includes an electronic structure, such as a battery, a circuit board assembly, etc., and a supercapacitor structure. The supercapacitor structure includes one or more layers of supercapacitors, and includes (or is configured as) a sheet structure fabricated and sized to overlie at least a portion of the electronic structure to, at least in part, facilitate electromagnetic shielding of the electronic structure. In one implementation, the sheet structure is a flexible sheet structure that is configured and sized to at least partially overlie opposing surfaces of the electronic component, for instance, by wrapping around the component. In this implementation, one or more contact tabs may electrically contact and be part of, or alternatively, extend outward from the supercapacitor structure to facilitate electrical connection to the supercapacitor structure. For instance, the one or more contact tabs may extend out from at least one edge of the flexible sheet structure. More particularly, the one or more contact tabs may include a multi-contact tab, wherein the multi-contact tab is configured and sized with multiple contact locations disposed external to the supercapacitor structure to facilitate multiple electrical connections to one or more components or one or more circuit board assemblies.

Reference is made below to the drawings, which are not drawn to scale for ease of understanding, wherein the same reference numbers used throughout different figures designate the same or similar components.

FIG. 1A illustrates one embodiment of an electronic assembly or device 100, in accordance with one or more aspects of the present invention. By way of example, device 100 may comprise part of a mobile consumer electronic device, such as a mobile phone, a tablet computer, a portable media player, a digital camera, etc. In this example, device 100 includes a supercapacitor structure 110, which includes one or more supercapacitors, such as one or more layers of supercapacitors.

As shown, one or more contact tabs 120 electrically contact and extend outward from supercapacitor structure 110, and may include, for example, one or more multi-contact tabs 122 configured and sized with multiple contact locations 123 disposed external to supercapacitor structure 110 to facilitate, for example, multiple electrical or mechanical connections, either separately or in combination, between a circuit board assembly 130 and supercapacitor structure 110. Contact tabs 120 may be, for example, foils, sheets of material, single wires, twisted pairs of wires, or coaxial cables, fabricated of a conductive material, such as one or more metals (including aluminum or copper) or graphite. In one example, multi-contact tab 122 may be a metal film, sheet, foil, etc., and may be partially coated with an insulator material, such that multiple contact locations 123 remain exposed. In another example, multi-contact tab 122 may include one or more layers of materials, including one or more layers of conductive material, and one or more layers of non-conductive material. Contact locations 123 could include any desired connection interface, for example, solder bumps, conductive pads, through-hole contacts, leads, adhesives, or other electrical or mechanical interfaces, depending on the technology used to connect multi-contact tab 122 to circuit board assembly 130. For example, solder bumps may be used to allow surface connection or mounting, and through-holes or posts may be used to facilitate electrical connection in one or more other implementations. In one example, contact locations 123 may directly connect to one or more components 140, which could be, for example, double-sided flip chip packages, while in other examples, contact locations 123 may connect to circuit board assembly 130 at locations close to components 140 to be electrically connected to the supercapacitor structure.

Circuit board assembly 130 may include, for example, one or more printed circuit boards of a mobile electronic device, and may have multiple layers and conductive features, including conductive planes, such as ground and signal planes, tracks, conductive traces, pads, vias, etc., and may include various different types of components 140, such as radio transceivers, processors, memory, camera devices, etc., which may be, for example, surface mounted, using, for example, ball grid array (BGA) packaging, or through-mounted, using posts. Contact locations 123 of multi-contact tab 122 may be designed to facilitate electrical contact to selected portions of circuit board assembly 130, including components 140 thereof. An insulator material (not shown), such as a polymer, plastic, glass, ceramic, porcelain, rubber, etc., material, may cover portions of contact tabs 120, in order to limit electrical connections to specific regions, so that, for example, multi-contact tab 122 may overlie or cover over circuit board assembly 130, to facilitate selectively electrically contacting circuit board assembly 130, including (for instance) components 140, while remaining electrically isolated from other underlying components. In one example, as depicted, supercapacitor structure 110 may be located adjacent to circuit board assembly 130, and in other examples, supercapacitor structure 110 may be located above, below, or within circuit board assembly 130.

Figure 1B:
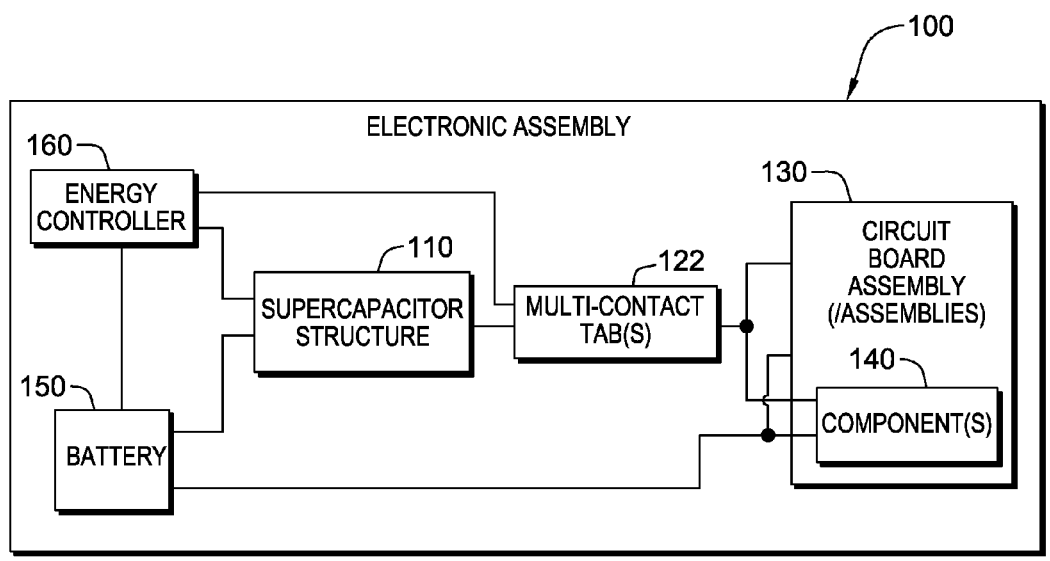
FIG. 1B is a block diagram of a more detailed embodiment of the electronic assembly or device of FIG. 1A, in accordance with one or more aspects of the present invention.

FIG. 1B is a block diagram of a more detailed embodiment of device 100 of FIG. 1A, illustrating an energy controller 160 that controls, regulates and/or balances the power paths between supercapacitor 110, a battery 150, circuit board assembly 130 and one or more components 140. Energy controller 160 may be electrically connected, through multiple inputs and outputs, to battery 150, supercapacitor structure 110, contact tabs 120 (including multi-contact tab 122), circuit board assembly 130, and components 140, and may include electronic circuitry, including, for example, programmable digital logic, capable of controlling and switching which energy storage device, for instance, supercapacitor 110 or battery 150, is connected (using the multiple inputs and outputs) to circuit board assembly 130 and/or components 140 via (for instance) multiple contact tabs 120. This controlling and switching may be responsive to energy demands from components of the device. In addition, energy controller 160 may control charging of the energy storage devices, including recharging of supercapacitor structure 110 by battery 150.

In one example, energy controller 160 could allow one component 140 to be alternately connected to supercapacitor 110 or battery 150, depending upon its operational mode. For example, energy controller 160 may be programmed to connect a radio transceiver to supercapacitor structure 110 responsive to an intermittent high power spike requirement, during for example, sending of data to a mobile communications network (which may require, for example a spiked current of 1.2 to 2.0 amperes for a duration of 2 to 4 milliseconds). In addition, energy controller 160 may be further configured or programmed to connect the radio transceiver to battery 150, responsive to a sustained power requirement, during for example, standby mode of the radio transceiver (which may require, for example, a current of 0.1 to 0.2 amperes for a duration of 40 or more milliseconds). As another example, energy controller 160 could detect a transient burst of energy, and store the energy in supercapacitor structure 110. By regulating access to battery 150 and supercapacitor structure 110, energy controller 160 decouples power requirements from energy requirements, and facilitates reducing energy waste, and thereby optimizing battery life of the associated portable electronic device.

Component(s) 140 may have different electrical characteristics, including different operating requirements for voltage, current, power, energy, and power supply resistance capacitance (RC) time constants, which may be best met in conjunction with different energy storage devices. In the normal operation of device 100 (such as a consumer electronic device), certain components 140, such as a processor, memory, display screen, etc., may steadily consume power, while other components 140, such as a radio transceiver, or a camera flash, may intermittently consume high power for a short duration. In such a case, using a combination of battery 150, such as a lithium-ion rechargeable battery, and supercapacitor structure 110, such as disclosed herein, could allow for optimal use of energy within device 100. For instance, battery 150 may have a higher energy density than a supercapacitor, and could provide energy to components 140, which are steadily consuming power, and the one or more supercapacitors may have a higher power density than battery 150, and could provide more instantaneous energy to components 140, which intermittently consume relatively high power. In one configuration, supercapacitor structure 110 could also be continually charged or recharged by battery 150, in order to have supercapacitor energy available when needed. By employing a combination of energy storage devices, such as supercapacitors and traditional batteries 150, the overall efficiency of energy use within the system can be improved, thereby enhancing battery life and performance of the consumer electronic device 100.

In another aspect, electromagnetic interference may be suppressed by the multi-contact tab(s) 122 and supercapacitor structure(s) 110 disclosed herein. Electromagnetic interference (EMI), such as radio-frequency interference (RFI), may be externally originating or internally originating within device 100. EMI is a disturbance, which when left unsuppressed, may affect performance of device 100, including components 140, and circuit board assembly 130. As one example, EMI may interfere with the function of an audio circuit in a smart phone, degrading the quality of the audio signal. Common external sources which may initiate EMI include televisions, computer monitors, cordless telephones, microwave ovens, etc., and internally originating EMI may originate, for example, in a mobile radio subsystem communicating with, for example, a cell phone tower. Advantageously, the multi-contact tab 122 disclosed herein may be sized and configured to facilitate suppressing EMI from reaching, for instance, electronic components 140 and/or circuit board assembly 130. In one embodiment, multi-contact tab 122 may comprise a sheet or film of metal of any appropriate thickness, which acts as a barrier shield to electromagnetic radiation. In yet another embodiment, multi-contact tab 122 may include one or more additional layers or films of material, including conductive or insulating material, with material properties that tend to further suppress EMI, or may facilitate heat dissipation. Thus, in accordance with one or more aspects of the present invention, multi-contact tab 122 may advantageously facilitate electrical contact between multiple electronic devices and supercapacitor structure 110, and simultaneously facilitate suppressing EMI from reaching, for instance, the multiple electronic components 140 and/or circuit board assembly 130. Similarly, supercapacitor structure 110 may also be disposed over one or more components 140 and/or one or more regions of circuit board assembly 130, which would further facilitate blocking EMI from reaching those components or regions of circuit board assembly 130. Note that in one embodiment, supercapacitor structure 110 may include layers of supercapacitors, for example layers of inverted bipolar supercapacitors (FIG. 1C) or stacked layers of bipolar supercapacitors (FIG. 2B), which would include current collectors made of a conductive material, for example a metal, such as a foil. For example, supercapacitor structure 110 may have 3 or 4 layers of a conductive material, such as 3 or 4 layers of metal foil, and thereby provide EMI shielding without the need for a decoupling or bypass capacitor.

In one example, resistive and lumped capacitive elements (not shown) may be included within supercapacitor structure 110 to provide enhanced absorption of internally generated fields (including harmonic content of current pulses), for example, at high frequencies. In a further example, an array of low-loss, high frequency, capacitive elements (not shown) may be included within the periphery of supercapacitor structure 110, and could be used as a waveguide-below-cutoff structure at high frequency, or high frequency energy could be bypassed to external circuits. Advantageously, such designs may suppress undesirable antenna-like behavior of supercapacitor structure 110 by confining currents and controlling the propagation of EMI.

In another example, supercapacitor structure 110 may include materials chosen to enhance magnetic and/or thermal shielding. For example, supercapacitor structure 110 may include materials, such as mu-metals, chosen for their magnetic permeability. In another example, supercapacitor structure 110 may include an electrolyte material designed to absorb EMI or RFI. In a further example, supercapacitor structure 110 may be enclosed by a protective pouch (not shown), made of a suitable insulator material, which may also act as an EMI and/or thermal shield.

Figure 1C:
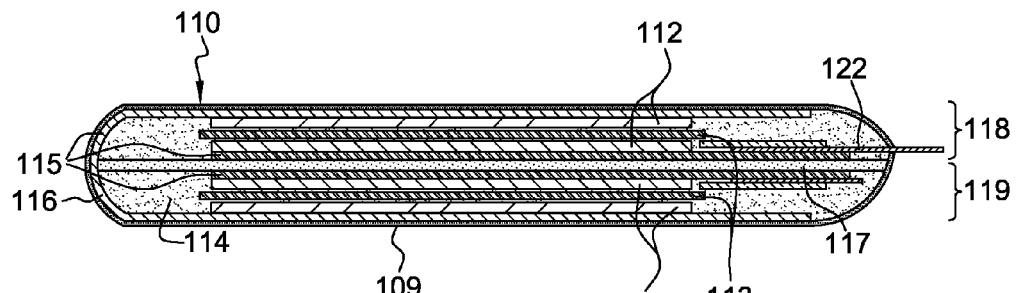
FIG. 1C is a partial cross-sectional elevational view of one embodiment of the supercapacitor structure of FIG. 1A, taken along line 1C-1C thereof, in accordance with one or more aspects of the present invention.

FIG. 1C is a partial cross-sectional elevational view of one embodiment of supercapacitor structure 110 of FIG. 1A. As depicted, in one embodiment, supercapacitor structure 110 includes one or more layers of supercapacitors 118, 119. One supercapacitor 118, 119 may include, for example, two electrodes 112 separated by a separator 113, and electrically connected by ions of an electrolyte 114 located between the two electrodes. Electrodes 112 may be fabricated of a porous, or spongy, material, which may have a large specific surface area (such as activated carbon, amorphous carbon, carbon aerogel, graphene, or carbon nanotubes), for instance, a specific surface area of 500-1000 square meters per gram, due to micro-porosity, while electrolyte 114 may include a solvent with dissolved chemicals, such as potassium hydroxide (KOH). Electrodes 112 of supercapacitors 118, 119 may be connected to one or more current collector(s) 115, which may include a conductive material, such as a metal, for instance, aluminum or copper. Current collector(s) 115 may act as terminals, such as positively charged anodes or negatively charged cathodes, of supercapacitors 118, 119.

As depicted by way of example, in an inverted bipolar configuration, the two supercapacitors (such as first supercapacitor 118 and a second supercapacitor 119) are coupled in series, and separated by a dielectric sealer 117. These supercapacitors may share, for example, a bipolar C-shaped current collector 116 within supercapacitor structure 110. Advantageously, the inverted bipolar configuration allows bipolar C-shaped current collector 116 to be accessed from anywhere on the surface of supercapacitors 118, 119, because in an inverted bipolar configuration, bipolar C-shaped current collector 116 wraps around first supercapacitor 118 and second supercapacitor 119, and at least partially encircles supercapacitors 118, 119. In such an inverted bipolar configuration, contact tabs 120 may connect to bipolar C-shaped current collector 116 or to current collectors 115 located within supercapacitors 118, 119, providing (for instance) access to different voltage levels from supercapacitor structure 110. For instance, if each supercapacitor 118, 119 has a voltage capacity of 2.7 volts (V), and a multi-contact tab 122' is connected to ground, then bipolar C-shaped current collector 116 may deliver 2.7 V, because it is connected in series with single supercapacitor 119, while multi-contact tab 122 may deliver 5.4 V, because it is connected in series with both supercapacitors 118, 119.

Figure 1D:
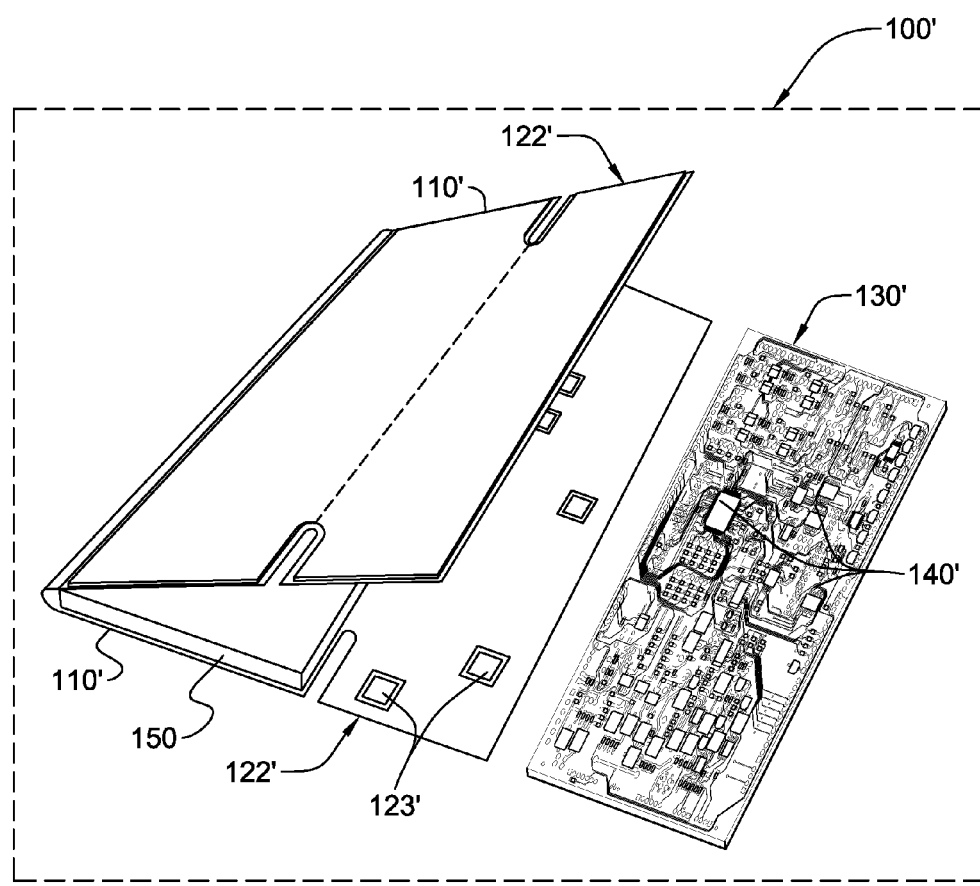
FIG. 1D depicts another embodiment of an electronic assembly or device having a supercapacitor structure wrapping, at least in part, around a battery to supply power to one or more components of the electronic assembly, in accordance with one or more aspects of the present invention.

FIG. 1D depicts an exploded view of another embodiment of an electronic assembly or device 100', which may include a supercapacitor structure 110' wrapping around battery 150. As shown, supercapacitor structure 110' may be folded or hinged to wrap around battery 150, and thereby facilitate providing EMI shielding of battery 150. In this embodiment, one or more multi-contact tabs 122' may extend from one or more edges of supercapacitor structure 110'. Contact locations 123' on one multi-contact tab 122' are shown. These contact locations 123' may be disposed to facilitate electrical connection of supercapacitor structure 110' to multiple locations on circuit board assembly 130', which may be, for example, a main processing board of a smart phone. As depicted, two multi-contact tabs may be provided to fold over or envelope circuit board assembly 130', and thereby facilitate electrical connection between contact locations 123' and circuit board assembly 130' (e.g., on both main sides thereof), and facilitate EMI shielding of circuit board assembly 130', as well as one or more components 140' mounted to the circuit board assembly. In one example, supercapacitor structure 110' may be a thermal shield, absorbing, dissipating, or reflecting heat from either an external or internal source, such as one or more components 140' or a battery 150. For example, supercapacitor structure 110' may wrap around battery 150, and facilitate uniform distribution of the heat of battery 150 to eliminate hot spots, allowing battery 150 to operate more efficiently, because materials of supercapacitor structure 110', including, for example, an external pouch (not shown) containing supercapacitor structure 110', electrodes 112 (FIG. 1C), and separators 113 (FIG. 1C), may have desirable thermal properties, allowing for convection or conduction of heat. In another embodiment, a supercapacitor structure may be, at least partially, rolled into a cylindrical shape to, for example, fit into a housing or chassis of an electronic assembly or device.

Figure 1E:
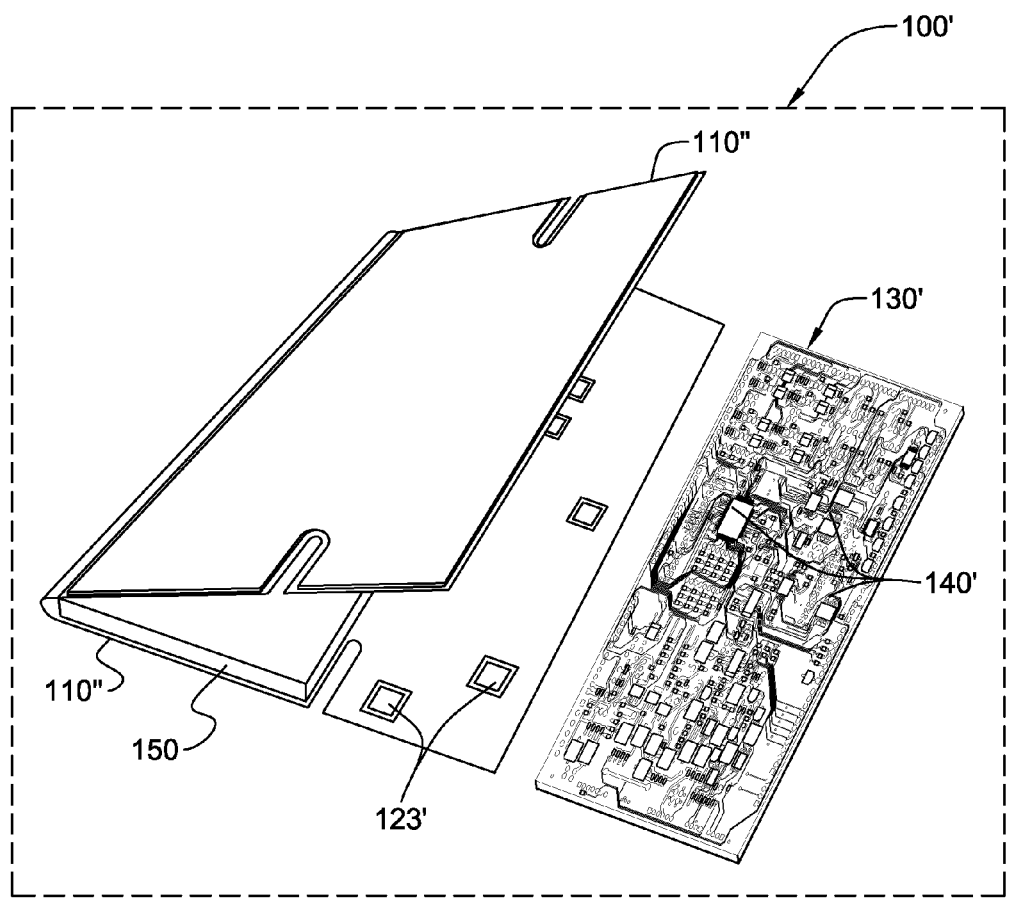
FIG. 1E depicts an alternate embodiment of the electronic assembly or device of FIG. 1D, having a supercapacitor structure wrapping, at least in part, around a circuit board assembly, in accordance with one or more aspects of the present invention.

FIG. 1E depicts an alternate embodiment of the assembly or device 100'. As depicted, supercapacitor structure 110" may be folded or hinged to wrap around battery 150 and circuit board assembly 130', and thereby facilitate providing EMI shielding of battery 150 and circuit board assembly 130', including one or more components 140' mounted to circuit board assembly 130'. Supercapacitor structure 110" may have an external conducting surface, partially coated with a non-conductive material, with exposed contact locations 123' disposed thereon to facilitate electricity to multiple locations on either side of circuit board assembly 130'.

In another embodiment, the supercapacitor structure may be a foldable rectangular structure, having a fold or crease line, or may be shaped as two rectangles connected by a bridge structure, wherein the bridge structure is foldable. In such an example, a folded supercapacitor structure may reduce EMI or RFI by having, for example, a power contact tab extending from a top portion of the folded structure, and a ground contact tab extending from a bottom portion of the folded structure, wherein the ground and power contact tabs are configured to be self-cancelling, and cancel out internal or reflected EMI from the supercapacitor structure. In such an embodiment, the supercapacitor structure may enclose an electronic assembly, such as one or more batteries, circuit board assemblies, or components, and may act as a Faraday cage. Advantages of such a configuration may also include enhanced secrecy or security, because blocking EMI emissions from the electronic assembly could prevent an outside observer from detecting aspects of the operations of the electronic assembly by monitoring known EMI signatures of various components.

In another embodiment, the supercapacitor structure may have one or more impedance matched contact tabs, which are designed to connect to the supercapacitor structure to reduce any EMI emissions from the electron flow from the current collectors to the contact tab. For example, the supercapacitor may be configured as a paired-strip, low-impedance transmission line structure, which could confine the fields generated by current flowing on inner surfaces of the supercapacitor structure (or one or more contact tabs) within the supercapacitor structure (or one or more contact tabs). In another example, the supercapacitor structure may be configured as a balanced transmission line structure to minimize external coupling of internally generated magnetic fields (for example, at low frequencies) through vector cancellation.

Figure 2A:
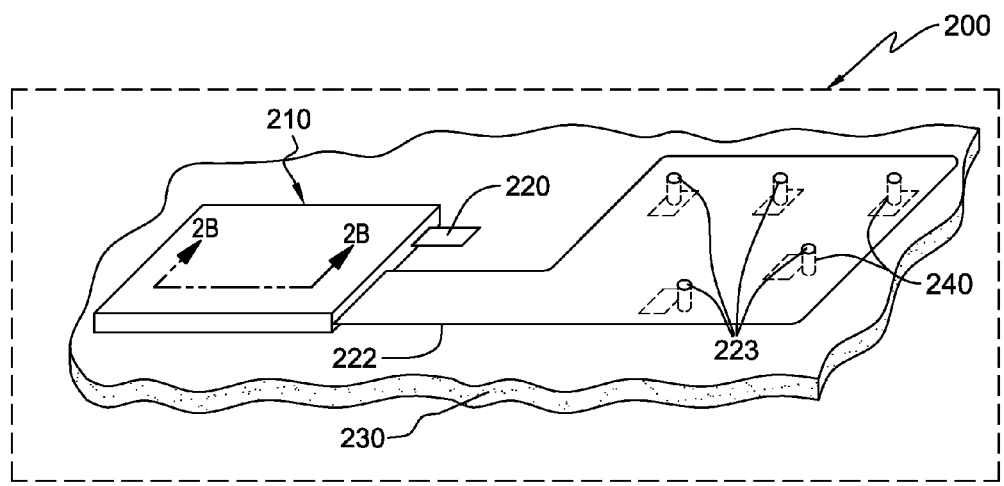
FIG. 2A depicts another embodiment of an electronic assembly or device having a supercapacitor structure with one or more contact tabs extending therefrom, including a multi-contact tab, in accordance with one or more aspects of the present invention.

FIG. 2A illustrates another embodiment of an electronic assembly or device 200, which comprises a supercapacitor structure 210 and one or more contact tabs 220, which electrically contact and extend outward from supercapacitor structure 210. Contact tabs 220 may include, for example, a multi-contact tab 222, which may have multiple contact locations 223 external to supercapacitor structure 210 that facilitate electrical connection between a circuit board assembly 230, or one or more components 240 mounted thereon, with supercapacitor structure 210. As depicted, supercapacitor structure 210 may overlie circuit board assembly 230 (in one embodiment). In one example, contact locations 223 may include or align to conductive posts connecting multi-contact tab 222 to, for instance, circuit board assembly 230, at specific locations. For example, components 240 may be electrically connected to supercapacitor structure 210 with either a direct connection to multi-contact tab 222 or a connection through the board, via a conductive post extending to the board, and located close to component 240.

Figure 2B:
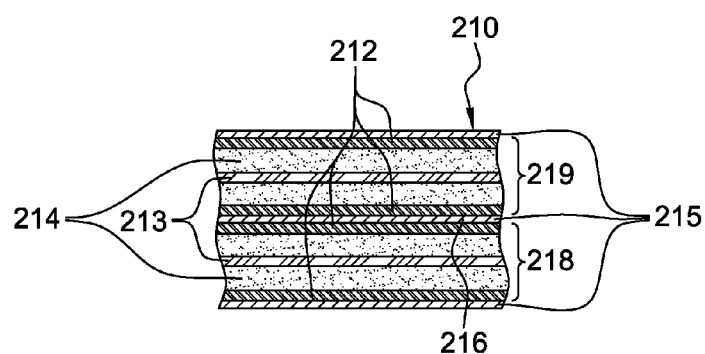
FIG. 2B is a partial cross-sectional elevational view of one embodiment of the supercapacitor structure of FIG. 2A, taken along line 2B-2B thereof, in accordance with one or more aspects of the present invention.

FIG. 2B is a partial cross-sectional elevational view of one embodiment of supercapacitor structure 210 of FIG. 2A. As depicted, in one embodiment, supercapacitor structure 210 includes one or more stacked supercapacitors 218, 219, arranged in a stacked bipolar configuration. In this configuration, supercapacitors 218, 219 are coupled in series, sharing, for example, a bipolar current collector 216, located between supercapacitors 218, 219. Note that supercapacitor 218 may include a shared bipolar current collector 216 and a negative current collector of current collectors 215, and supercapacitor 219 may also include shared bipolar current collector 216, as well as a positive current collector of current collectors 215. Advantageously, the stacked bipolar configuration depicted may allow a bottom surface of supercapacitor structure 210 to be a ground plane, and a top surface thereof to provide access to the combined supercapacitor voltage, for example, 5.4 V, of 2.7 V supercapacitors 218, 219, while access to an intermediate voltage (for example, 2.7 V) continues to be available at the sides of supercapacitor structure 210 thru current collectors 215.

Figure 3A:
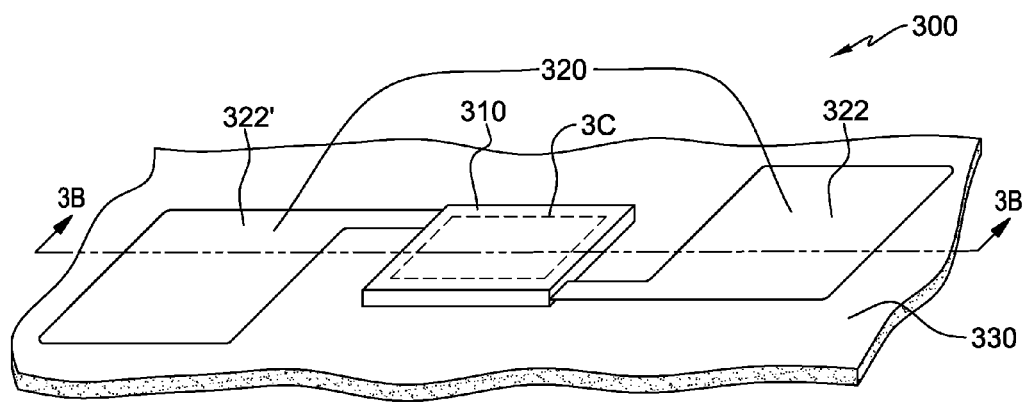
FIG. 3A depicts a further embodiment of an electronic assembly or device having a supercapacitor structure with multiple multi-contact tabs extending therefrom, in accordance with one or more aspects of the present invention.

FIG. 3A illustrates a further embodiment of an electronic assembly or device 300, which comprises a supercapacitor structure 310 and one or more contact tabs 320 that electrically contact and extend outward from supercapacitor structure 310 to facilitate electrical connection to supercapacitor structure 310. Contact tabs 320 include, for example, one or more multi-contact tabs, such as a first multi-contact tab 322 and a second multi-contact tab 322', which may each be configured and sized with multiple contact locations 323, 323' disposed external to supercapacitor structure 310. As depicted, supercapacitor structure 310 may be disposed over a portion of circuit board assembly 330, and as one example, first multi-contact tab 322 and second multi-contact tab 322 may extend from opposite sides of supercapacitor structure 310 to overlie second and third portions or regions of the circuit board assembly 330. In one embodiment, first multi-contact tab 322 may be electrically connected to supercapacitor structure 310 to provide access to a first voltage, which may be, for example, approximately 9 V, by electrical contact to, for instance, a current collector in series with 3 or 4 supercapacitors, while second multi-contact tab 322' may be electrically connected to supercapacitor structure 310 to provide access to a second voltage, which may be, for example, approximately 2.7 volts, via electrical contact to a current collector in series with a single supercapacitor of the supercapacitor structure 310.

Figure 3B:
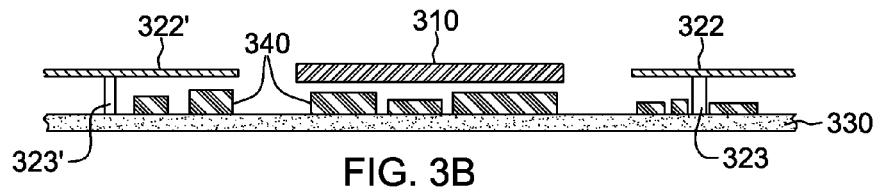
FIG. 3B is a partial cross-sectional elevational view of the electronic assembly of FIG. 3A, taken along line 3B-3B thereof, and depicting the supercapacitor structure and the multi-contact tabs overlying different regions of a circuit board assembly, in accordance with one or more aspects of the present invention.
Figure 3C:
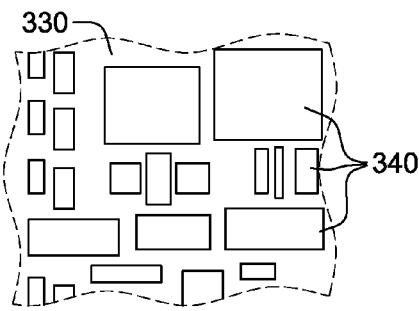
FIG. 3C is a plan view of the electronic assembly of FIG. 3A, showing one embodiment of the region within line 3C thereof, in accordance with one or more aspects of the present invention.

FIG. 3B is a partial cross-sectional elevational view of device 300 of FIG. 3A. As depicted, in one embodiment, circuit board assembly 330 includes one or more components 340 mounted thereto, which may be any of a variety of components of an electronic device. As shown, multi-contact tabs 322, 322' may be configured and sized to reside over different portions of circuit board assembly 330 to, in part, facilitate electromagnetic interference shielding thereof. FIG. 3C is a detailed example of the circuit board assembly of FIG. 3A, showing region 3C thereof, and illustrating different components 340 mounted to the board.

As depicted in FIG. 3B, contact locations 323, 323' may include, for example, posts electrically connecting the multi-contact tabs to components 340.

Figure 4:
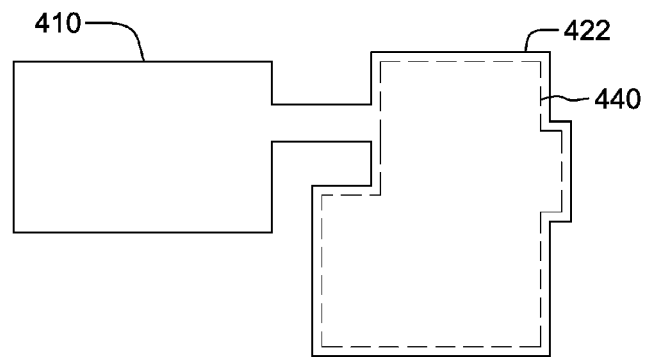
FIG. 4 is a plan view of one embodiment of an electronic assembly or device having a supercapacitor structure with a multi-contact tab configured and sized to overlie an adjacent or associated circuit board assembly, in accordance with one or more aspects of the present invention.

FIG. 4 illustrates another embodiment of an electronic assembly or device 400 having a supercapacitor structure 410, a multi-contact tab 422 and a circuit board assembly or a component 440 with a main surface. As depicted, in one example, multi-contact tab 422 may be a film tab which overlies or underlies the component. The film tab may have a surface area at least as large as the area of the main surface of the component.

As noted above, in one embodiment, multi-contact tab 422 is, for example, a film or foil of conductive material, such as aluminum, which may be configured and sized as needed for a particular application. Customizing multi-contact tab 422 may be performed to ensure complete coverage of component(s) 440, and thereby enhance EMI shielding of those components. Multi-contact tab 422 electrically connects directly to component 440, or may electrically connect to component 440 through a circuit board assembly to which component 440 is mounted. As one example, disposing multi-contact tab 422 100-200 micrometers above component 440 may provide effective EMI shielding against, for example, 2.4 gigahertz (GHz) EMI which has a wavelength of approximately 0.125 meters, since such EMI would not effectively penetrate any side gap of approximately one-thousandths of its wavelength.

In another embodiment, the supercapacitor structure may be configured and sized to overlie irregular electronic assemblies, such as batteries, circuit board assemblies, or components, by including shaped portions such as notches, holes, or neckings. In one example, the shaped portions may be spanned by a material, such as a metal, pouching, polymer (for example polyethylene terephthalate), or pressure sensitive adhesive (PSA). In such a case, there may or may not be an electrical connection provided to the shaped portion, or the shaped portion may be or include a contact location. In another example, the supercapacitor structure may be a sheet structure having one or more regions including supercapacitors, interspersed with one or more regions not including supercapacitors.

Figure 5A:
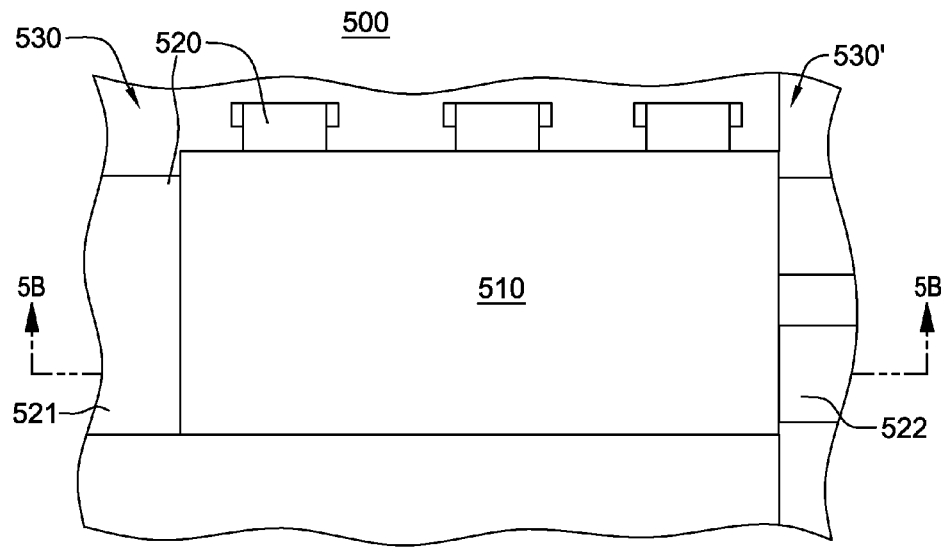
FIG. 5A is a plan view of another embodiment of an electronic assembly or device having a supercapacitor structure, with one or more contact tabs facilitating electrical connection from one or more circuit board assemblies to the supercapacitor structure, in accordance with one or more aspects of the present invention.
Figure 5B:
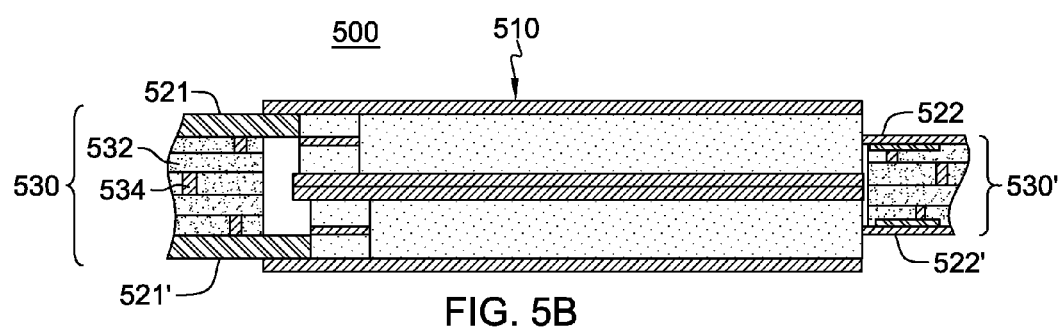
FIG. 5B is a partial cross-sectional elevational view of the electronic assembly of FIG. 5A, taken along line 5B-5B thereof, and depicting the one or more contact tabs electrically contacting or extending into different regions of the one or more circuit board assemblies, in accordance with one or more aspects of the present invention.

FIG. 5A illustrates another embodiment of an electronic assembly or device 500 having a supercapacitor structure 510 and one or more contact tabs 520, including a multi-contact tab 521 and a multi-contact tab 522 extending out from opposite sides of supercapacitor structure 510, which facilitate electrical connection to, for instance, a first circuit board assembly 530 and a second circuit board assembly 530'. FIG. 5B is a partial cross-sectional elevational view of one embodiment of device 500 of FIG. 5A.

As shown in FIG. 5B, circuit board assemblies 530, 530' may include a printed circuit board (PCB), which electrically connects and mechanically supports one or more electronic components. Electrical connection of these components, which may be surface mounted to the PCB, may be achieved through the use of conductive tracks or pads etched into one or more layers 532 of circuit board assembly 530, and conductive vias 534 may electrically interconnect layers 532. In a PCB, one or more layers may be direct current (DC) power planes or ground planes, providing access to ground or different power voltage levels to any component mounted on circuit board assembly 530, 530'. Ground planes and DC power planes may also provide EMI shielding, because alternating current EMI could be effectively shielded by either a ground plane or DC power plane. In the embodiment illustrated, two multi-contact tabs 521, 521' extend in planar fashion from supercapacitor structure 510 to form, for instance, power and ground planes, respectively, for circuit board assembly 530. Similarly, two multi-contact tabs 522, 522' may extend in an opposite direction from supercapacitor structure 510 in planar fashion over or within circuit board assembly 530' to provide power and ground planes, respectively, for circuit board assembly 530'. By way of example, contact tab 521 may distribute a first voltage to circuit board assembly 530, and contact tab 522 may distribute a second voltage to circuit board assembly 530', where the first and second voltages may be the same or different voltages.

Figure 5C:
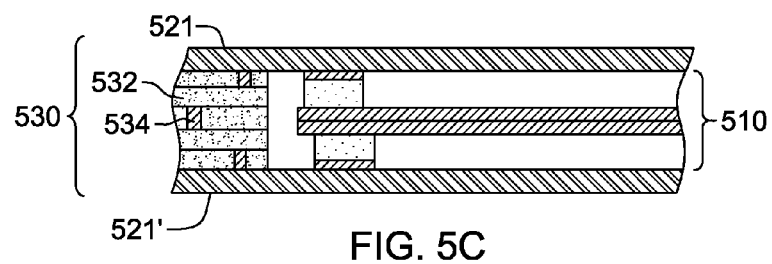
FIG. 5C depicts an alternate embodiment of an electronic assembly or device having a supercapacitor structure, with one or more contact tabs facilitating electrical connection from one or more circuit board assemblies to the supercapacitor structure, in accordance with one or more aspects of the present invention.

FIG. 5C is an alternate embodiment of the device of FIG. 5B. As depicted, in one example, supercapacitor structure 510 may be incorporated as part of circuit board assembly 530, advantageously providing an integrated package with reduced structures and interconnection points. For instance, supercapacitor structure 510 may be located within a recess in one or more layers of circuit board assembly 530. By way of example, circuit board assembly 530 may have a thickness of ⅟32 of an inch, or approximately 800 micrometers, and supercapacitor structure 510 may have a thickness of between 200 and 300 micrometers. Supercapacitor structure 510 may be configured as disclosed herein, for instance, with one or more stacked bipolar supercapacitors (see FIG. 2B), or one or more inverted bipolar supercapacitors (see FIG. 1C). Supercapacitor structure 510 may couple to one or more multi-contact tabs 521, 521' configured, sized, and disposed as, for example, one or more DC power planes or ground planes within circuit board assembly 530, and which may be accessed by, for instance, components mounted on circuit board assembly 530. Depending on the desired circuit architecture, supercapacitor structure 510 may be located at an edge of circuit board assembly 530, a central region of circuit board assembly 530, or within one or more distinct layers of circuit board assembly 530. In another embodiment, the one or more multi-contact tabs may extend as conductive traces within a layer or metallization of a circuit board assembly, and a supercapacitor structure may be, for example, mounted on or adjacent to the circuit board assembly.

Figure 6A:
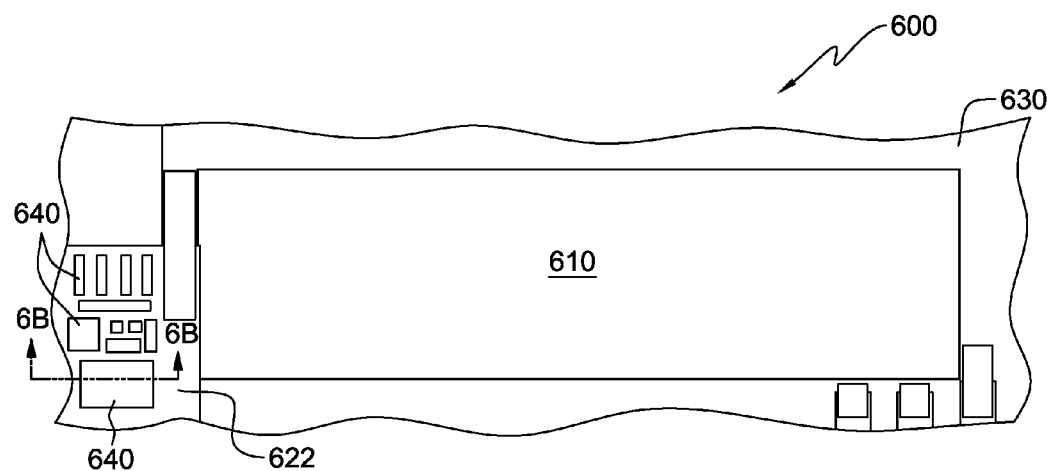
FIG. 6A is a plan view of a further embodiment of an electronic assembly or device having a supercapacitor structure residing over a circuit board assembly and having a multi-contact tab extending therefrom to facilitate electrical connection to the supercapacitor structure, in accordance with one or more aspects of the present invention.
Figure 6B:
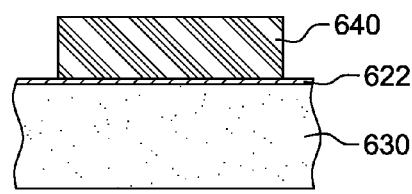
FIG. 6B is a partial cross-sectional elevational view of the device of FIG. 6A, taken along line 6B-6B thereof, in accordance with one or more aspects of the present invention.

FIG. 6A illustrates a further embodiment of an electronic assembly or device 600 having a supercapacitor structure 610 disposed over a circuit board assembly 630, which includes one or more components 640 mounted thereon. FIG. 6B depicts one embodiment of device 600 of FIG. 6A, taken along line 6B-6B thereof. As depicted, in one example, a multi-contact tab 622 extends from superconductor structure 610 and resides over at least a portion of circuit board assembly 630, between one or more components 640 and the circuit board assembly. In this example, multi-contact tab 622 could extend as a conductive trace on an upper layer of circuit board assembly 630. By so disposing multi-contact tab 622, components 640 could have, in one embodiment, direct access to energy stored in supercapacitor structure 610. In addition, as explained above, multi-contact tab 622 may be sized and configured to function as an EMI block or suppression film to, for instance, suppress EMI radiating from one or more components 640, downwards towards circuit board assembly 630, or suppress EMI propagating through circuit board 630 towards one or more components 640. As in the above embodiments, multi-contact tab 622 may have an insulative film or layer over the tab, and have specified exposed contact locations positioned to facilitate making electrical contact with, for instance, component 640 and circuit board 630, at desired locations. Thus, multi-contact tab 622 may be employed to electrically connect the supercapacitor structure 610 to a variety of components and circuit board assembly locations, while at the same time, facilitate suppression of external or internal EMI within the device.

Figure 7A:
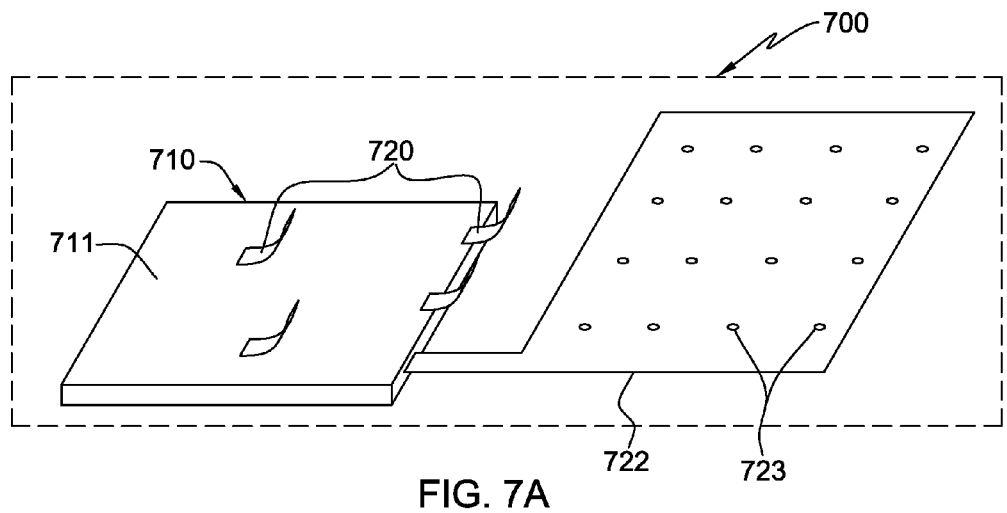
FIG. 7A depicts another embodiment of an electronic assembly or device having a supercapacitor structure with one or more contact tabs, in accordance with one or more aspects of the present invention.

FIG. 7A illustrates another embodiment of an electronic assembly or device 700 having a supercapacitor structure 710 with multiple contact tabs 720 extending therefrom. As illustrated, a multi-contact tab 722 with multiple contact locations 723 extends outward from one or more sides of supercapacitor structure 710, in an analogous manner to the embodiments described above.

Figure 7B:
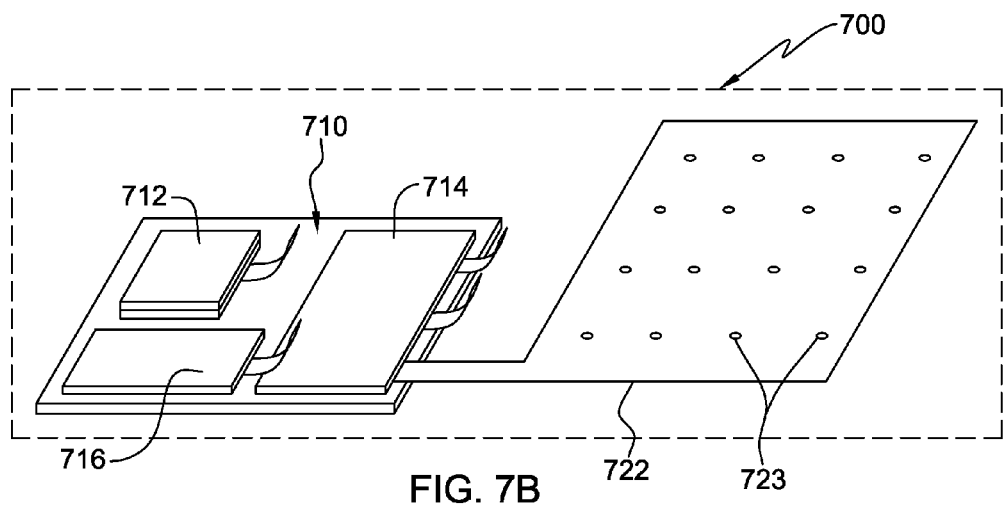
FIG. 7B is an internal view of one embodiment of the electronic assembly of FIG. 7A, with multiple supercapacitor subassemblies depicted, in accordance with one or more aspects of the present invention.

FIG. 7B is an internal view of one embodiment of supercapacitor structure 710, which is shown to include a first supercapacitor 712, a second supercapacitor 714, and a third supercapacitor 716. Each supercapacitor 712, 714, and 716 of supercapacitor structure 710 may be configured to have, for example, a bipolar configuration such as, for example, an inverted bipolar configuration (see FIG. 1C), or a stacked bipolar configuration (see FIG. 2B). As depicted, first supercapacitor 712, second supercapacitor 714, and third supercapacitor 716, may be spaced apart to facilitate electrical isolation from one to another, and may be charged and discharged independently, as needed. The RC time constant of a supercapacitor and/or contact tab determines how fast a supercapacitor may either store or deliver an amount of energy. Some applications, such as refreshing of random access memory (RAM), may require delivery of energy over a period of minutes. Other applications, however, such as a camera flash, may require delivery of the same amount of energy over milliseconds. Each individual supercapacitor and/or contact tab may be configured to have an appropriate RC time constant, which may be different, to meet the energy storage and delivery needs of the component to which it may be coupled.

For example, in one embodiment, supercapacitor structure 712 may be electrically connected to radio transceiver components, supercapacitor 714 may be electrically connected to a media player component, and supercapacitor 716 may be electrically connected to a camera component. In operation, the media player component may be used to play media while the camera may be used to take a flash photograph. In such an example, the media player component and the camera component may each require a large amount of energy at the same time. By connecting each component to an electrically separate supercapacitor, these simultaneous demands for energy may each be met. In addition, at the same time, the electronic device may be receiving data from a data network, and the radio transceiver component may produce a spike of energy that could be electrically connected to supercapacitor 712. In such a manner, some of the supercapacitors 712, 714, or 716, of supercapacitor structure 710, may be storing energy from a component at the same time as others deliver energy to a different component.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A device comprising:
    a supercapacitor structure, the supercapacitor structure comprising one or more layers of supercapacitors; and
    one or more contact tabs, the one or more contact tabs electrically contacting and extending outward from the supercapacitor structure to facilitate electrical connection to the supercapacitor structure, and the one or more contact tabs comprising:
        a multi-contact tab, the multi-contact tab being configured and sized with multiple contact locations disposed external to the supercapacitor structure; and
    wherein the supercapacitor structure is configured and sized to reside over at least a portion of a main surface of a battery to, in part, facilitate electromagnetic interference shielding of the battery.

2. The device of claim 1, wherein the multi-contact tab is configured and sized to reside over at least a portion of a circuit board assembly to, in part, facilitate electromagnetic interface shielding thereof, the multiple contact locations of the multi-contact tab facilitating multiple electrical connections between the circuit board assembly and the supercapacitor structure.

3. The device of claim 2, wherein the circuit board assembly includes a component having a main surface with a main surface area, and the multi-contact tab comprises a film tab with a surface area at least as large as the main surface area of the main surface of the component.

4. The device of claim 2, wherein the supercapacitor structure is disposed over the circuit board assembly, including over one or more components mounted to the circuit board assembly, and facilitates electromagnetic interference shielding of the one or more components.

5. The device of claim 1, wherein the supercapacitor structure comprises a flexible sheet, and wherein the supercapacitor structure is configured and sized to wrap around and at least partially cover opposing main surfaces of the battery.

6. The device of claim 1, wherein the multi-contact tab comprises a film tab with a surface area greater than a surface area of a main surface of the supercapacitor structure.

7. The device of claim 1, wherein the supercapacitor structure comprises a shared C-shaped current collector and the one or more layers of supercapacitors comprise a first supercapacitor and a second supercapacitor, the first supercapacitor comprising the shared C-shaped current collector, and the second supercapacitor also comprising the shared C-shaped current collector, and wherein the shared C-shaped current collector at least partially encircles the first and second supercapacitors.

8. The device of claim 7, wherein the first and second supercapacitors reside within the shared C-shaped current collector of the supercapacitor structure.

9. The device of claim 8, wherein the multi-contact tab electrically contacts to and extends outward from the shared C-shaped current collector of the supercapacitor structure.

10. A device comprising:
a supercapacitor structure, the supercapacitor structure comprising one or more layers of supercapacitors, and
one or more contact tabs, the one or more contact tabs electrically contacting and extending outward from the supercapacitor structure to facilitate electrical connection to the supercapacitor structure, and the one or more contact tabs comprising:
a multi-contact tab, the multi-contact tab being configured and sized with multiple contact locations disposed external to the supercapacitor structure;
wherein the supercapacitor structure comprises a shared C-shaped current collector and the one or more layers of supercapacitors comprise a first supercapacitor and a second supercapacitor, the first supercapacitor comprising the shared C-shaped current collector, and the second supercapacitor also comprising the shared C-shaped current collector, and wherein the shared C-shaped current collector at least partially encircles the first and second supercapacitors; and
wherein the first supercapacitor further comprises another current collector and the one or more contact tabs further comprise another multi-contact tab, the another multi-contact tab being configured and sized with multiple contact locations thereto disposed external to the supercapacitor structure, and the another multi-contact tab electrically contacts to the another current collector, and the multi-contact tab is electrically connected to distribute a first voltage, and the another multi-contact tab is electrically connected to distribute a second voltage, wherein the first voltage and second voltage are different voltages.

11. The device of claim 1, wherein the multi-contact tab is configured and sized to provide electromagnetic interference shielding to a majority of an associated circuit board assembly.

12. A device comprising:
a supercapacitor structure, the supercapacitor structure comprising one or more layers of supercapacitors; and
one or more contact tabs, the one or more contact tabs electrically contacting and extending outward from the supercapacitor structure to facilitate electrical connection to the supercapacitor structure, and the one or more contact tabs comprising:
a multi-contact tab, the multi-contact tab being configured and sized with multiple contact locations disposed external to the supercapacitor structure; and
wherein the one or more layers of supercapacitors comprise a first supercapacitor and a second supercapacitor disposed within a stack, the first supercapacitor comprising a shared current collector and a negative current collector, the second supercapacitor comprising the shared current collector and a positive current collector, and wherein the shared current collector resides between the negative and positive current collectors.

13. The device of claim 12, wherein the multi-contact tab electrically contacts to the shared current collector of the first and second supercapacitors in the stack.

14. The device of claim 13, wherein the one or more contact tabs further comprise another multi-contact tab, the another multi-contact tab being configured and sized with multiple contact locations thereto disposed external to the supercapacitor structure, and the another multi-contact tab electrically contacting one of the negative current collector or the positive current collector.

15. The device of claim 14, wherein the multi-contact tab and the another multi-contact tab extend from one of a same side of the supercapacitor structure, or different sides of the supercapacitor structure.

16. The device of claim 12, wherein the multi-contact tab is configured and sized to cover a first portion of one or more circuit board assemblies, and the multiple contact locations of the multi-contact tab facilitate multiple electrical connections between the first portion of the one or more circuit board assemblies and the supercapacitor structure, and the another multi-contact tab is configured and sized to cover a second portion of the one or more circuit board assemblies, and the multiple contact locations of the another multi-contact tab facilitate multiple electrical connections between the second portion of the one or more circuit board assemblies and the supercapacitor structure.

17. The device of claim 12, wherein the multi-contact tab is electrically connected to the supercapacitor to distribute a first voltage, and the another multi-contact tab is electrically connected to the supercapacitor to distribute a second voltage, wherein the first voltage and second voltage are different voltages.

18. The device of claim 12, wherein the one or more layers of supercapacitors of the supercapacitor structure comprise a first supercapacitor and a second supercapacitor, the first supercapacitor being electrically isolated from the second supercapacitor within the supercapacitor structure, and the multi-contact tab being electrically connected to the first supercapacitor.

19. The device of claim 18, wherein the multi-contact tab is a first contact tab and the one or more contact tabs further comprise a second contact tab, the second contact tab being electrically connected to the second supercapacitor of the supercapacitor structure.

20. The device of claim 19, wherein the first contact tab is electrically connected to the first supercapacitor to distribute a first voltage from the supercapacitor structure, and the second contact tab is electrically connected to the second supercapacitor to distribute a second voltage from the supercapacitor structure, wherein the first voltage and second voltage are different voltages.

21. The device of claim 19, wherein the first contact tab electrically connected to the first supercapacitor has a first resistance capacitance (RC) time constant and the second contact tab electrically connected to the second supercapacitor has a second RC time constant, wherein the first RC time constant and the second RC time constant are different RC time constants.

* * * * *